United States Patent [19]

Youmans

[11] 4,424,440

[45] Jan. 3, 1984

[54] AUTOMATIC PHOTOCELL LOADING

[75] Inventor: Barry J. Youmans, Rittman, Ohio

[73] Assignee: The Babcock & Wilcox Company, New Orleans, La.

[21] Appl. No.: 311,845

[22] Filed: Oct. 16, 1981

[51] Int. Cl.³ ............................................. G02B 27/00
[52] U.S. Cl. ................................ 250/206; 250/214 A; 307/311
[58] Field of Search ..................... 307/311, 549, 555; 250/554, 206, 214 R, 214 A

[56] References Cited

U.S. PATENT DOCUMENTS 4,158,144 6/1979 Krause ............................. 307/311 X Primary Examiner—David C. Nelms
Assistant Examiner—Darwin R. Hostetter
Attorney, Agent, or Firm—James A. Hudak; Vytas R. Matas; Robert J. Edwards

[57] ABSTRACT

A circuit (10) that prevents a photo diode (12) from reaching its saturation output voltage thus ensuring the sensitivity of the photo diode to small changes in radiance at high radiance levels is disclosed. The circuit utilizes a transistor (30) that is allowed to conduct after the output voltage of the photo diode (12) has reached a predetermined level thus shunt loading the photo diode preventing it from reaching its saturation level. A resistor (28)-capacitor (32) time constant circuit is provided preventing the transistor (30) from conducting until the output voltage of the photo diode (12) has reached a predetermined level for a predetermined period of time thus preventing premature conduction of the transistor (30) in response to transient or spurious voltages.

9 Claims, 2 Drawing Figures

AUTOMATIC PHOTOCELL LOADING

TECHNICAL FIELD

The present invention relates generally to a photocell detection circuit, and more particularly to a circuit which allows a photocell, while under a high radiance, to be sensitive to relatively small changes in such radiance.

BACKGROUND ART

An inherent disadvantage in using photo diodes as detectors in the photovoltaic mode is that the output voltage curve of such a photo diode rises sharply under low illumination levels and is substantially linear in this range but then flattens out and asymptotically approaches some output voltage. In the low illumination range, the photo diode is sensitive to changes in illumination, however, after the "knee" in the voltage response curve is reached, the photo diode becomes saturated and is insensitive to small changes or pulsations in the light source which typically go undetected. The inherent disadvantage causes serious problems in those detector systems whose primary function is the detection of small pulsations in the light source at high illumination levels.

Various attempts have been made to circumvent this inherent disadvantage, such as resistive shunt loading of the photo diode or the use of optical filters, however, these approaches are typically useful only at constant illumination levels and do not automatically compensate for large changes in light intensity so as to be usable over a wide range of intensity levels. Thus, the prior art approaches do compensate for the inherent saturation of the photo diode, but cannot be used over a wide range of light intensities.

Because of the foregoing, it has become desirable to develop control circuitry which permits a photo diode to be sensitive to small changes in radiance at high radiance levels and which can be used over a wide range of radiance levels.

SUMMARY OF THE INVENTION

The present invention solves the aforementioned problems associated with the prior art as well as other problems by providing circuitry that prevents a photo diode from reaching saturation thus ensuring its sensitivity to small changes in radiance even at high radiance levels. This is accomplished by providing circuitry that allows a transistor to conduct after the output voltage of the photo diode has surpassed a predetermined level thus shunt loading the photo diode which, in turn, prevents the photo diode from reaching its saturation level. A resistive-capacitive time constant circuit is provided to prevent the transistor from conducting until the output voltage of the photo diode has reached a predetermined steady state condition, thus preventing the premature conduction by the transistor in response to a transient or spurious output voltage from the photo diode. The components of the circuitry are chosen so that the transistor starts conduction prior to the photo diode reaching the "knee" of its output voltage response curve. In this manner, the output voltage of the photo diode is less than its saturation voltage and the photo diode is responsive to small changes in radiance even at high radiance levels.

In view of the foregoing, it will be seen that one aspect of the present invention is to provide circuitry which prevents the photo diode from reaching its saturation level thus ensuring its sensitivity to small changes in radiance over a wide range of radiance levels.

Still another aspect of the present invention is to provide circuitry which causes a transistor to automatically shunt load a photo diode after the output voltage of the photo diode has reached a predeterminded level, thus preventing the photo diode from reaching its saturation level.

These and other aspects of the present invention will become more clearly understood after a review of the following description of the preferred embodiment when considered with the following drawings.

DESCRIPTION OF THE PREFERRED EMBODIMENT

Figure 1:
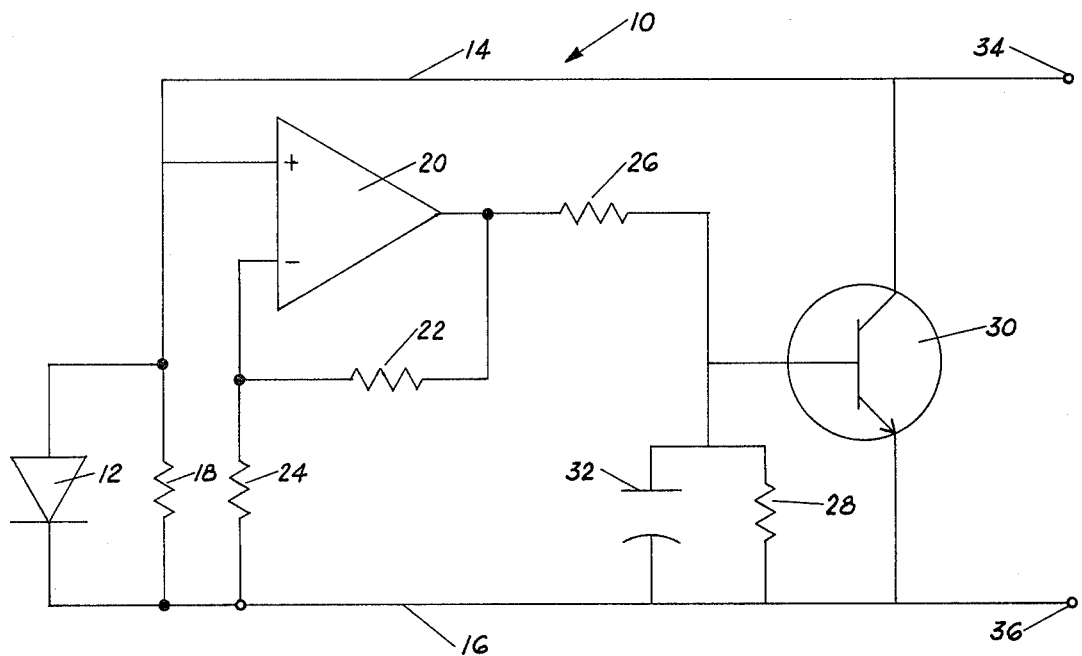
FIG. 1 is an electrical schematic of the invention of this disclosure.

Referring now to the drawings where the illustrations are for the purpose of describing the preferred embodiment of the present invention and are not intended to limit the invention hereto, FIG. 1 shows a loading circuit 10 for a photo diode 12 which can be used in numerous types of detection applications, such as oil and coal fired utility and industrial burners.

In this circuit the anode of the photo diode 12 is connected to a conductor 14 and the cathode is connected to a conductor 16. A load resistor 18 is connected across the photo diode 12 and is connected to the conductors 14 and 16, the latter conductor 14 is connected to the positive input of an operational amplifier 20 whose output is connected to its negative input via a resistor 22. The negative input of the operational amplifier 20 is, in turn, connected to the conductor 16 via a resistor 24. The output of the operational amplifier 20 is also connected to the conductor 16 via resistors 26, 28, which form a voltage divider network. The junction of the resistors 26 and 28 is connected to the base of an NPN transistor 30 and to a capacitor 32 which is connected across the resistor 28 to the conductor 16. The collector of the transitor 30 is connected to the conductor 14 whereas the emitter of the transistor 30 is connected to the conductor 16. The conductors 14 and 16 are then terminated in output terminals 34 and 36, respectively.

Figure 2:
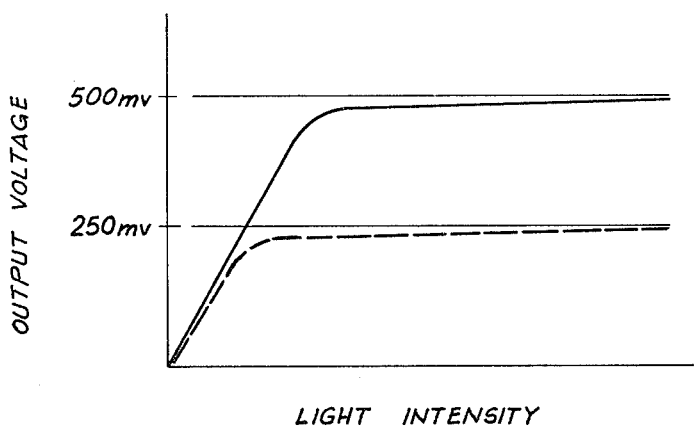
FIG. 2 is a graph of photo diode output voltage versus light intensity.

Referring now to FIG. 2, the output of the photo diode is shown by the solid line to be generally logarithmic in nature, i.e., as light intensity increases, the slope of the output voltage of the photo diode asymptotically approaches some constant output voltage, e.g. 500 mv. During the initial portion of this curve, the output voltage of the photo diode varies substantially linearly with respect to light intensity, however, as the "knee" in the curve is reached, the photo diode 12 approaches saturation and the slope of the curve dramatically changes resulting in a substantial reduction in the increase of output voltage as the light increases. Because of this, the overall sensitivity of this system substantially decreases as light intensity increases. Thus, when the photo diode is operating near saturation, small changes in the output of the light source can go undetected. If, however, the output of the photo diode 12 could be prevented from approaching saturation, it could be used over a substantially larger range of light intensities and thus in many more applications. Such is the case with the dotted response curve shown in FIG. 2 which is the response curve of a photo diode that is prevented from approaching its saturation level. This dotted response curve is the resulting response curve when the transistor 30 conducts, thus shunt loading the photo diode 12, as described below.

Regarding the operation of this circuit, refer to FIG. 1. When low intensity light strikes the photo diode 12, a voltage is generated across the output terminals of this device and is applied to the load resistor 18 and to the output terminals 34, 36 via conductors 14 and 16, respectively. If the intensity of the light which impinges upon the photo diode 12 is low, the photo diode will be operating in a linear portion of its response curve and any change in light intensity will result in a substantial change in output voltage. In this mode of operation, the circuit is responsive to small changes or pulsations in light intensity and such variations are readily detected as changes in the output voltage.

The output voltage of the photo diode 12 is also applied to the positive input of the operational amplifier 20 whose gain is regulated by the respective values for the resistors 22 and 24. The amplifier output voltage is then applied to the transistor 30 via the voltage divider network formed by the resistors 26 and 28. All of the foregoing resistors, i.e., resistors 22, 24, 26 and 28, are chosen so that the resulting voltage appearing at the junction of the resistors 26 and 28 and applied to the base of the transistor 30 is insufficient to cause conduction of the transistor 30 at low light intensities. Thus, at low light intensity levels, the output voltage produced by the photo diode, which is substantially linear with respect to light intensity, is applied across the output terminals 34 and 36, and the transistor 30 does not conduct.

As the intensity of the light which impinges upon the photo diode diode 12 is increased, the voltage applied to the positive terminal of the operational amplifier 20 also increases, which, in turn, results in an increase in the voltage which is applied to the base of the transistor 30. When sufficient voltage is applied to the base of the transistor 30, transistor 30 starts conducting so as to shunt load the photo diode 12. When this occurs, the output voltage curve of the photo diode 12 assumes the shape shown by the dotted response curve in FIG. 2. As the light intensity is further increased, conduction through the transistor 30 further increases which results in additional shunt loading of the photo diode 12 preventing the photo diode from saturating. Thus, because of the shifting from one linear response curve to another linear curve, the photo diode 12 is prevented from reaching saturation and the circuit is sensitive and responsive to changes in light intensity over a wide range of intensities for a specific application.

The capacitor 32 which shunts the resistor 28 is used to provide a sufficient time constant so that spurious or transient light increases upon the photo diode 12 will not cause the transistor 30 to conduct. Thus, the intensity of the light which impinges upon the photo diode 12 must impinge thereon for a sufficient time to overcome the inherent time constant of the resistor-capacitor circuit formed by resistor 28 and capacitor 32.

As previously mentioned, the value of the components of the circuit 10 can be chosen so that the transistor 30 starts conducting prior to reaching the "knee" of the photo diode response curve. In order to accomplish this, typically resistor 22 has a resistance which is approximately 20 times that of resistor 24 so that the operational amplifier 20 will have a gain of approximately 20. In addition, the resistance of resistor 26 is typically nine or ten times that of resistor 28. Thus, the voltage which appears at the base of the transistor 30 is approximately twice the output voltage generated by the photo diode 12. In a typical installation, the solid response curve for the photo diode asympototically approaches 500 millivolts and would do so if the loading circuit 10 was not present. In this typical application, transistor 30 is selected so as to start conducting when approximately 500 millivolts are applied to its base. Therefore, when the photo diode 12 has generated approximately 250 millivolts across its output, 500 millivolts will be applied to the base of the transistor 30 and this transistor starts conducting. This occurs prior to the photo diode 12 reaching the "knee" in its response curve and results in the shunt loading of the photo diode 12. The resulting output voltage curve then shifts to that shown as a dotted line in FIG. 2 and thus the photo diode 12 does not reach saturation and is responsive to small changes in light intensity. This output voltage is applied across the terminals 34 and 36 which, in turn, are connected to any type of detection circuit which requires an input voltage that is proportional to the light intensity which impinges upon the photo diode.

Certain modifications and improvements will occur to those skilled in the art upon reading the foregoing. It should be understood that all such modifications and improvements have been deleted herein for the sake of conciseness and readability, but are properly within the scope of the following claims.

I claim:

1. A circuit for regulating the output voltage of a device having a logarithmic output signal comprising loading means connected across the output of the device, amplifying means connected across said loading means to amplify the output voltage produced by the device, and switching means connected to the output of said amplifying means, said switching means being actuated at a predetermined voltage applied thereto by said amplifying means resulting in the shunt loading of the device preventing the output voltage of the device from approaching a flat portion of the logarithmic output signal.

2. The regulating circuit as defined in claim 1 further including means preventing the actuation of said switching means until said predetermined voltage has been applied thereto for a predetermined period of time.

3. The regulating circuit as defined in claim 2 wherein said preventing means comprises time contstant circuitry connected to the input of said switching means.

4. The regulating circuit as defined in claim 1 further including a voltage dividing means connected between said amplifying means and said switching means, said voltage dividing means producing said predetermined voltage applied to the input terminal of said switching means.

5. The regulating circuit as defined in claim 4 wherein a portion of said voltage dividing means forms a part of time constant circuitry connected to the input of said switching means preventing the actuation thereof until said predetermined voltage has been applied thereto for a predetermined period of time.

6. A circuit for regulating the output voltage of a photocell comprising a photo diode, loading means connected across the output of said photo diode, amplifying means connected across said loading means to amplify the output voltage produced by said photo diode, and switching means connected to the output of said amplifying means and being actuated at a predetermined voltage applied thereto by said amplifying means, actuation of said amplifying means resulting in the shunt loading of said photo diode preventing the output voltage of said photo diode from approaching its saturation level.

7. The regulating circuit as defined in claim 6 further including means preventing the actuation of said switching means until said predetermined voltage has been applied thereto for a predetermined period of time.

8. The regulating circuit as defined in claim 6 further including a voltage dividing means electrically connected between said amplifying means and said switching means, said voltage dividing means producing said predetermined voltage applied to said switching means, a portion of said voltage dividing means forming a part of time constant circuitry connected to the input of said switching means preventing the actuation thereof until said predetermined voltage has been applied thereto for a predetermined period of time.

9. A circuit for regulating the output voltage of a photocell comprising a photo diode, loading means connected across the output of said photo diode, amplifying means connected across said loading means to amplify the output voltage produced by said photo diode, voltage dividing means connected to the output of said amplifying means, switching means connected to said voltage dividing means and actuated at a predetermined voltage applied thereto by said voltage dividing means, and means preventing the actuation of said switching means until said predetermined voltage has been applied thereto for a predetermined period of time, actuation of said amplifying means resulting in the shunt loading of said photo diode preventing the output voltage of said photo diode from approaching its saturation level.

* * * * *